US012796040B2

(12) United States Patent
Chen et al.

(10) Patent No.: US 12,796,040 B2
(45) Date of Patent: Nov. 10, 2026

(54) SEMICONDUCTOR DEVICE

(71) Applicant: WIN SEMICONDUCTORS CORP., Taoyuan (TW)

(72) Inventors: Wei-Ju Chen, Taoyuan (TW); Chun-Han Song, Taoyuan (TW); Rong-Hao Syu, Taoyuan (TW)

(73) Assignee: WIN SEMICONDUCTORS CORP., Taoyuan City (TW)

( * ) Notice: Subject to any disclaimer, the term of this patent is extended or adjusted under 35 U.S.C. 154(b) by 438 days.

(21) Appl. No.: 18/498,251

(22) Filed: Oct. 31, 2023

(65) Prior Publication Data

US 2025/0142916 A1 May 1, 2025

(51) Int. Cl.

| | |
|---|---|
| ***H01L 21/78*** | (2006.01) |
| ***H10D 30/47*** | (2025.01) |
| ***H10D 62/85*** | (2025.01) |
| ***H10D 64/62*** | (2025.01) |

(52) U.S. Cl.

CPC ........... *H10D 62/85* (2025.01); *H10D 30/475* (2025.01); *H10D 62/8503* (2025.01); *H10D 64/62* (2025.01)

(58) Field of Classification Search

CPC .. H10D 62/85; H10D 30/475; H10D 62/8503; H10D 64/62; H10D 30/015; H10D 30/4755

USPC .......................................................... 257/194

See application file for complete search history.

(56) References Cited

U.S. PATENT DOCUMENTS

| | | | | |
|---|---|---|---|---|
| 5,930,610 A * | 7/1999 | Lee | H10D 30/0612 | 438/572 |
| 6,051,454 A * | 4/2000 | Anda | H01L 21/28587 | 257/E21.407 |
| 6,967,407 B2 | 11/2005 | Otani | | |
| 7,221,015 B2 * | 5/2007 | Ando | H10B 53/30 | 257/296 |
| 7,468,295 B2 * | 12/2008 | Shim | H01L 21/0331 | 438/574 |
| 7,750,370 B2 * | 7/2010 | Smorchkova | H10D 64/518 | 257/E29.246 |

(Continued)

FOREIGN PATENT DOCUMENTS

TW 202340995 A 10/2023

OTHER PUBLICATIONS

Chinese language office action dated Aug. 20, 2024, issued in application No. TW 112148396.

(Continued)

*Primary Examiner* — Vu A Vu

(74) *Attorney, Agent, or Firm* — McClure, Qualey & Rodack, LLP

(57) ABSTRACT

A semiconductor device includes: a substrate; a first insulating film disposed on the substrate and having at least one via; and a second insulating film disposed on the first insulating film. The semiconductor device further includes: a first adhesion layer disposed on the first insulating film; a first conductive structure disposed in the at least one via and having an extended portion extending to a top surface of the first insulating film; and a second adhesion layer disposed on the first conductive structure. The first adhesion layer covers at least a part of a bottom surface of the extended portion, and the second adhesion layer covers at least a part of a top surface of the first conductive structure.

20 Claims, 5 Drawing Sheets

(56) References Cited

U.S. PATENT DOCUMENTS

| | | | | |
|---|---|---|---|---|
| 8,006,377 | B2 | 8/2011 | En | |
| 9,276,101 | B2 * | 3/2016 | Green | H10D 30/675 |
| 9,293,367 | B2 | 3/2016 | Sulfridge | |
| 9,660,065 | B2 | 5/2017 | Ozaki et al. | |
| 9,882,064 | B2 | 1/2018 | Yamazaki | |
| 10,566,428 | B2 * | 2/2020 | LaRoche | H10D 84/05 |
| 10,741,496 | B2 * | 8/2020 | Huang | H10D 64/251 |
| 10,868,045 | B2 | 12/2020 | Yamazaki | |
| 11,164,839 | B2 | 11/2021 | Chen | |
| 11,616,046 | B2 | 3/2023 | Lin | |
| 11,749,607 | B2 | 9/2023 | Wu | |
| 2022/0140126 | A1 * | 5/2022 | LaRoche | H10D 62/8503 257/183 |

OTHER PUBLICATIONS

Chinese language office action dated Sep. 19, 2025, issued in application No. TW 112148396.

Chinese language office action dated May 9, 2025, issued in application No. TW 112148396.

* cited by examiner

SEMICONDUCTOR DEVICE

BACKGROUND

Technical Field

The present disclosure relates to a semiconductor device, and in particular it relates to the adhesion layer of a semiconductor device.

Description of the Related Art

The semiconductor integrated circuit (IC) industry has experienced rapid growth. In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these integrated circuits. Parallel advances in manufacturing have allowed increasingly complex designs to be fabricated with precision and reliability.

However, these advances have increased the complexity of processing and manufacturing integrated circuits. Since feature sizes continue to decrease, fabrication processes continue to become more difficult to perform. Therefore, it is a challenge to form reliable semiconductor devices at smaller and smaller sizes.

SUMMARY

In an embodiment, a semiconductor device includes: a substrate; a first insulating film disposed on the substrate and having at least one via; and a second insulating film disposed on the first insulating film. The semiconductor device further includes: a first adhesion layer disposed on the first insulating film; a first conductive structure disposed in the at least one via and having an extended portion extending to a top surface of the first insulating film; and a second adhesion layer disposed on the first conductive structure. The first adhesion layer covers at least a part of a bottom surface of the extended portion, and the second adhesion layer covers at least a part of a top surface of the first conductive structure.

In another embodiment, a semiconductor device includes: a III-V compound semiconductor substrate; a first insulating film disposed on the substrate and having at least one via; and a second insulating film disposed on the first insulating film. The semiconductor device further includes: a first adhesion layer disposed on the first insulating film; a conductive structure disposed in the at least one via and on a top surface of the first insulating film; and a second adhesion layer disposed on the conductive structure. At least a part of the conductive structure is sandwiched between the first adhesion layer and the second adhesion layer.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
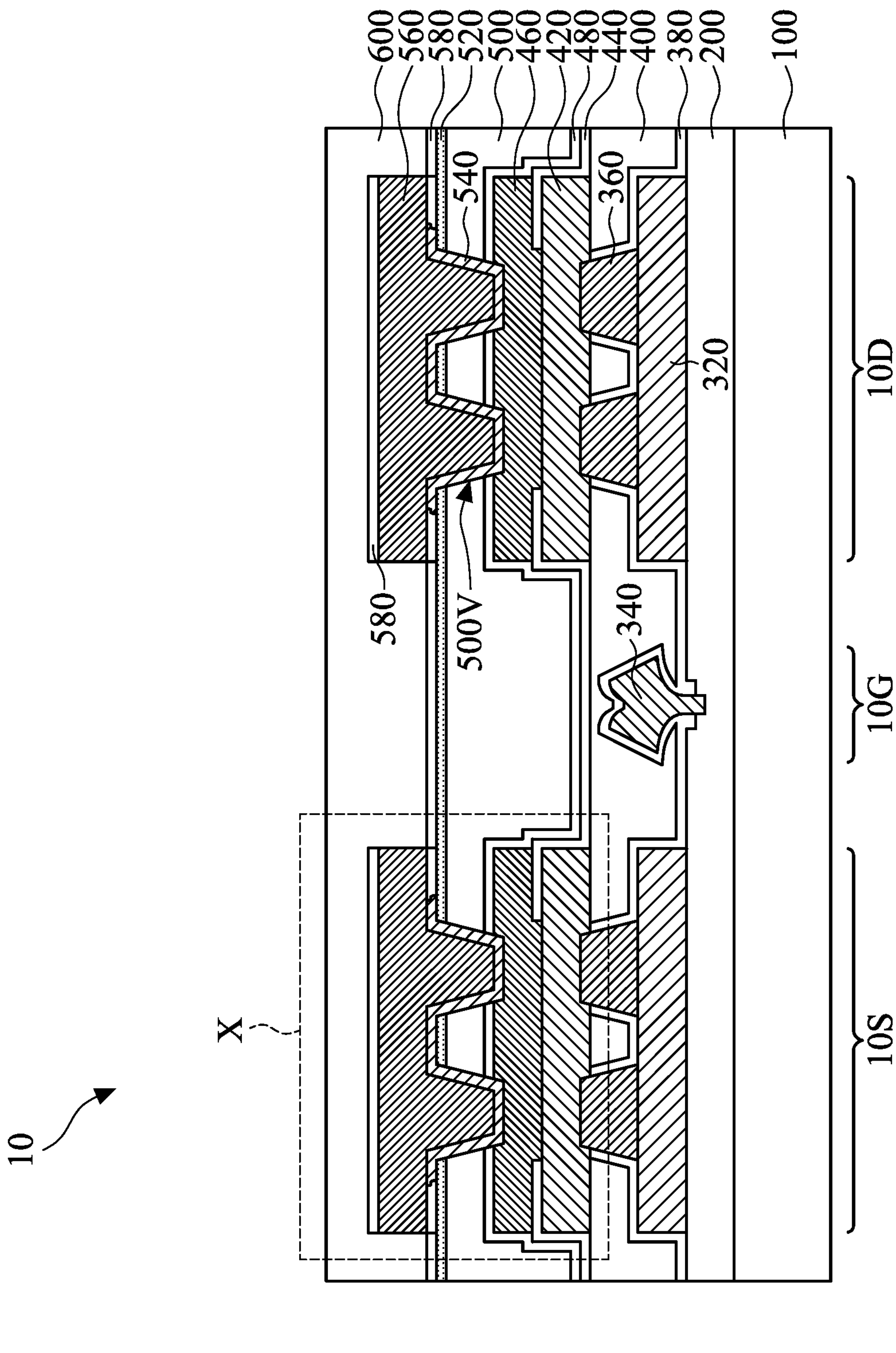
FIG. 1 is a cross-sectional view of a semiconductor device, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In a high-power and a high-frequency semiconductor device, such as a high electron mobility transistor (HEMT), a complex circuit layout may be designed on the wafer frontside. Specifically, when various metal layers are stacked, it would be necessary to incorporate planarization processes between metal layers to prevent line cracks or fractures. In some embodiments, after a layout of a first metal layer is deposited on the epitaxial surface, an insulating layer with a planarized surface should be introduced to cover the entire epitaxial surface and the first metal layer. After that, a different layout of a second metal layer may be deposited on the planar surface of the insulating layer, without being affected by the structural profile of the underlying first metal layer. When a micro-strip line structure is processed, a large area of electrode is necessary to establish electrical ground at the wafer frontside, and thus the appropriate planarization is a crucial factor to ensure the semiconductor device operates effectively.

A conventional semiconductor device may implement the insulation layer that is made of benzocyclobutene (BCB). Benzocyclobutene is a benzene ring fused into a cyclobutane ring. Applications of benzocyclobutene may include an insulator between redistribution wiring (as mentioned above), an inter-layer dielectric (ILD), a blocking layer between sensitive integrated circuit (IC) devices, or a laminate adhesive in a package structure. The material characteristics of benzocyclobutene may exhibit an external curing behavior in the temperature range between 220° C. and 270° C. The cured benzocyclobutene can demonstrate superior thermal stability, high glass transition temperature, and low dielectric constant. The above mentioned characteristics make benzocyclobutene ideal choice for constituting a planar platform.

Despite the advantages stated above, benzocyclobutene is highly soluble in a wide range of solvent at room temperature. In some embodiments, benzocyclobutene can absorb aqueous solution by nature, which leads to moisture (or impurities) entering the material layer of benzocyclobutene. During the reliability qualification, a semiconductor device including benzocyclobutene may easily fail due to the moisture uptake. In some embodiments, a biased highly accelerated stress test (bHAST) may combine parameters of voltage bias, high temperature, high humidity, high pressure, and duration to measure the reliability of the semiconductor device. In a specific case, the semiconductor device may be tested under the voltage bias between 3V and 6V, the temperature of 130° C., the relative humidity of 85%, the pressure of 33.3 psia, and the time of 96 hours. Simply put, the biased highly accelerated stress test may function as a corrosion failure test, which uncovers flaws of package seals, materials, or joints over a short period of time. Therefore, the semiconductor device containing benzocyclobutene may often encounter reliability issue.

Conventionally, it is known to those skilled in the art that the application of the benzocyclobutene material may lead to the reliability (such as the biased highly accelerated stress test) failure. According to some embodiments of the present disclosure, an adhesion layer is introduced to be interposed between the insulating film of benzocyclobutene and the plated conductive structure. The placement of the adhesion layer may minimize the moisture from entering the benzocyclobutene material. As a result, the reliability (such as the biased highly accelerated stress test) of the semiconductor device may be improved.

FIG. 1 is a cross-sectional view of a semiconductor device 10, according to some embodiments of the present disclosure. In some embodiments, a semiconductor device may contain any number of active components and passive components. The active components may include metal-oxide semiconductor (MOS) transistor, complementary metal-oxide semiconductor (CMOS) transistor, lateral-diffused metal-oxide semiconductor (LDMOS) transistor, bipolar complementary metal oxide semiconductor-double diffused metal oxide semiconductor (BCD) transistor, planar transistor, fin field-effect transistor (finFET), gall-all-around field-effect transistor (GAA FET), the like, or a combination thereof. The passive components may include metal lines, capacitors, inductors, resistors, diodes, bonding pads, or the like. For simplicity, FIG. 1 only illustrates one transistor structure. According to some embodiments of the present disclosure, the transistor structure may be a high electron mobility transistor. The semiconductor devices 10 may be compartmentalized into a source region 10S, a drain region 10D, and a gate region 10G of the transistor structure (such as the high electron mobility transistor). The source region 10S and the drain region 10D are positioned respectively on opposing sides of the gate region 10G.

Referring to FIG. 1, the semiconductor devices 10 may include a substrate 100, an epitaxial layer 200, an ohmic layer 320, a gate structure 340, a metal layer 360, a dielectric layer 380, an insulating film 400, a metal layer 420, a dielectric layer 440, a metal layer 460, a dielectric layer 480, an insulating film 500, an adhesion layer 520, a seed layer 540, a metal layer 560, an adhesion layer 580, an insulating film 600. The substrate 100, the epitaxial layer 200, the dielectric layer 380, the insulating film 400, the dielectric layer 440, the dielectric layer 480, the insulating film 500, the adhesion layer 520, the adhesion layer 580, and the insulating film 600 may be extended across the source region 10S, the drain region 10D, and the gate region 10G. The ohmic layer 320, the metal layer 360, the metal layer 420, the metal layer 460, and the seed layer 540 may be disposed in the source region 10S and the drain region 10D, while the gate structure 340 may be disposed in the gate region 10G. The metal layer 560 may be extended beyond the source region 10S or the drain region 10D. The seed layer 540 and the metal layer 560 may be collectively seen as a first conductive structure, which is electrically connected to the metal layer 460 through via holes 500V.

Still referring to FIG. 1, the substrate 100 may also be, for example, a wafer or a chip, but the present disclosure is not limited thereto. In some embodiments, the substrate 100 may be a semiconductor substrate, for example, silicon (Si) substrate. Furthermore, in some embodiments, the semiconductor substrate may also be an elemental semiconductor including germanium (Ge), a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or a combination thereof. In a specific embodiment of the present disclosure, the substrate 100 may be made of any suitable III-V compound semiconductor material.

In other embodiments, the substrate 100 may also be a semiconductor on insulator (SOI) substrate. The semiconductor on insulator substrate may include a base plate, a buried oxide (BOX) layer disposed on the base plate, and a semiconductor layer disposed on the buried oxide layer. In some embodiments, the buried oxide layer may encapsulate the base plate, and may be a film of high thermal stability under high temperature.

In some embodiments, the substrate 100 may be an n-type or a p-type conductive type. In some embodiments, the n-type dopants may include phosphorus (P), arsenic (As), silicon (Si), selenium (Se), and tellurium (Te), while the p-type dopants may include boron (B), indium (In), aluminum (Al), carbon (C), magnesium (Mg), zinc (Zn), calcium (Ca), beryllium (Be), strontium (Sr), barium (Ba), and radium (Ra).

Referring to FIG. 1, the epitaxial layer 200 may be disposed on the substrate 100. According to some embodiments of the present disclosure, the epitaxial layer 200 may include various compound semiconductor films (not shown for simplicity). In some embodiments, the epitaxial layer 200 may include a channel film, which provides an electron transmitting path between the source region 10S and the drain region 10D, while the gate region 10G controls the electron flow. Materials of the epitaxial layer 200 may include gallium nitride, aluminum nitride (AlN), aluminum gallium nitride (AlGaN), aluminum indium nitride (AlInN), the like, or a combination thereof. The epitaxial layer 200 may be formed by metal organic chemical vapor deposition (MOCVD), atomic layer deposition (ALD), molecular beam epitaxy (MBE), liquid phase epitaxy (LPE), the like, or a combination thereof.

Still referring to FIG. 1, the ohmic layer 320 may be disposed on the epitaxial layer 200. According to some embodiments of the present disclosure, the ohmic layer 320 in the source region 10S and in the drain region 10D may function respectively as the source terminal and the drain terminal of the transistor structure (such as the high electron mobility transistor) of the semiconductor device 10. Materials of the ohmic layer 320 may include amorphous silicon, polysilicon, poly-SiGe, metal nitride (such as titanium nitride (TiN), tantalum nitride (TaN), tungsten nitride (WN), titanium aluminum nitride (TiAlN), or the like), metal silicide (such as nickel silicide (NiSi), cobalt silicide (CoSi), tantalum silicon nitride (TaSiN), or the like), metal carbide (tantalum carbide (TaC), tantalum carbon nitride (TaCN), or the like), metal oxide (such as titanium oxide (TiO) or the like), metals, other suitable materials, or a combination thereof, but the present disclosure is not limited thereto. Metals may include, but are not limited to, cobalt (Co), ruthenium (Ru), aluminum (Al), tungsten (W), copper (Cu), titanium (Ti), tantalum (Ta), silver (Ag), gold (Au), platinum (Pt), nickel (Ni), palladium (Pd), zinc (Zn), chromium (Cr), molybdenum (Mo), niobium (Nb), the like, a combination thereof, or a multiple layer thereof.

The ohmic layer 320 may be formed by depositing a metal layer on the epitaxial layer 200, followed by patterning the metal layer. The deposition process may include chemical vapor deposition (CVD), atomic layer deposition (ALD), physical vapor deposition (PVD), evaporation, plating, the like, or a combination thereof, but the present disclosure is not limited thereto. The patterning process may include photolithography process and etching process, the like, or a combination thereof.

In other embodiments, the patterned photoresist layer may first be formed on the epitaxial layer 200, followed by the metal layer deposition. During the photoresist removal process, the portion of the metal layer disposed on the photoresist layer may be removed along with the photoresist layer, and the remaining portion of the metal layer becomes the ohmic layer 320 that is disposed in the source region 10S and the drain region 10D.

It should be understood that the ohmic layer 320 may also constitute a diode structure (not shown). In some embodiments, in addition to forming the ohmic layer 320 in the source region 10S and in the drain region 10D, the ohmic layer 320 may be further disposed as a p-metal and an n-metal in the diode structure. Before forming the ohmic layer 320, a designated region of the epitaxial layer 200 may be recessed. The p-metal may stand on the non-recessed region of the epitaxial layer 200, while the n-metal may stand on the recessed region of the epitaxial layer 200.

Referring to FIG. 1, the gate structure 340 may be disposed on the epitaxial layer 200. According to some embodiments of the present disclosure, the gate structure 340 in the gate region 10G may function as the gate terminal of the transistor structure (such as the high electron mobility transistor) of the semiconductor device 10. The materials and the formation of the gate structure 340 may be similar to those of the ohmic layer 320, and the details are not described again herein to avoid repetition.

In some embodiments, the epitaxial layer 200 in the gate region 10G may be recessed to form a wide recess. The wide recess may be formed by etching process (such as a wet etching process). After the formation of the wide recess, a photoresist layer (not shown) may be coated. The photoresist layer may include a film of polymethylmethacrylates (PMMA) and a film of poly(methacrylic acid) (PMAA) that are sequentially stacked over the epitaxial layer 200 (including the wide recess) and the ohmic layer 320. An electron beam lithography (EBL) may be used for the exposure procedure. The electron beam lithography can write the pattern of the film of polymethylmethacrylates and the film of poly(methacrylic acid) with more superior spatial resolution. Due to the difference of the material characteristics between polymethylmethacrylates and poly(methacrylic acid), the pattern in the film of polymethylmethacrylates may be different from the pattern in the film of poly (methacrylic acid).

After the film of polymethylmethacrylates and the film of poly(methacrylic acid) are patterned, a gate recess may be formed under the wide recess. The dimension of the gate recess may be smaller than the dimension of the wide recess. The gate recess may be formed by the wet etching process. Next, a metal layer may be deposited, which may adapt the profile of the patterned film of polymethylmethacrylates and the patterned film of poly(methacrylic acid). The metal layer may be further extended through the wide recess and the gate recess, and may stand on the bottom surface of the gate recess. The metal layer having the desired profile becomes the gate structure 340, and a Schottky contact may be formed between the bottom surface of the gate structure 340 and the bottom surface of the gate recess.

As shown in FIG. 1, the lower portion of the gate structure 340 may correspond to the patterned film of polymethylmethacrylates, while the upper portion of the gate structure 340 may correspond to the patterned film of poly(methacrylic acid). In some embodiments, the upper portion of the gate structure 340 may be designed to have a larger dimension than the lower portion of the gate structure 340. A relatively larger upper portion of the gate structure 340 may allow the electron flow in the channel film to be more effectively controlled. The dimension of the gate structure 340 at the Schottky contact may be defined as the gate length. A relatively smaller gate length may allow the semiconductor device 10 to operate in higher power and in higher frequency. However, the smaller gate length may compromise the breakdown performance, and thus the wide recess may serve as a compensation for the breakdown voltage. The gate recess may serve to reduce the gate resistance.

Still referring to FIG. 1, the metal layer 360 may be disposed on the ohmic layer 320. The metal layer 360 may function as connection between other metal layers. The materials and the formation of the metal layer 360 may be similar to those of the ohmic layer 320, and the details are not described again herein to avoid repetition.

Referring to FIG. 1, the dielectric layer 380 may be conformally formed on the epitaxial layer 200, the ohmic layer 320, the gate structure 340, and the metal layer 360. In some embodiments, the dielectric layer 380 may also fill the wide recess and any remaining portion of the gate recess. According to some embodiments of the present disclosure, the dielectric layer 380 may provide mechanical protection and electrical insulation for the underlying structures. The dielectric layer 380 may be an inorganic film, and the materials thereof may include zirconium oxide ($ZrO_2$), aluminum oxide ($Al_2O_3$), silicon dioxide ($SiO_2$), silicon oxynitride (SiON), silicon nitride (SiN), silicon carbonitride (SiCN), silicon oxycarbonitride (SiOCN), aluminum nitride, titanium oxide ($TiO_2$), hafnium oxide ($HfO_2$), tantalum oxide ($Ta_2O_5$), the like, or a combination thereof. The dielectric layer 380 may be formed by chemical vapor deposition, high-density plasma chemical vapor deposition (HDP-CVD), plasma-enhanced chemical vapor deposition (PECVD), flowable chemical vapor deposition (FCVD), sub-atmospheric chemical vapor deposition (SACVD), atomic layer deposition (ALD), the like, or a combination thereof.

Still referring to FIG. 1, the insulating film 400 may be disposed on the dielectric layer 380. In some embodiments, the insulating film 400 may cover the epitaxial layer 200, the ohmic layer 320, the gate structure 340, and the metal layer 360. According to some embodiments of the present disclosure, the insulating film 400 may provide insulation and planarization for the intermediate structure of the semiconductor device 10. The insulating film 400 may be an organic insulating film, and the material thereof may include benzocyclobutene. The insulating film 400 may be formed by spin-on coating, chemical vapor deposition, atomic layer deposition, the like, or a combination thereof. A planarization process (such as chemical mechanical polish (CMP) or the like) may be performed on the insulating film 400. In addition to forming a planar surface of the insulating film 400, a portion of the dielectric layer 380 on an upper portion of the metal layer 360 may be removed, while the upper portion of the metal layer 360 may be protruded beyond the planar surface of the insulating film 400. This may ensure a more effective electrical connection to be established between the metal layer 360 and the subsequently formed metal layer 420.

Referring to FIG. 1, the metal layer 420 may be disposed on the planar surface of the insulating film 400. In some embodiments, the metal layer 420 may cover the protruded portion of the metal layer 360. According to some embodiments of the present disclosure, the metal layer 420 may function as a metal transmission line. The materials and the formation of the metal layer 420 may be similar to those of the ohmic layer 320, and the details are not described again herein to avoid repetition.

Still referring to FIG. 1, the dielectric layer 440 may be conformally formed on the insulating film 400 and the metal layer 420. According to some embodiments of the present disclosure, the dielectric layer 440 may provide mechanical protection and electrical insulation for the underlying structures. The materials and the formation of the dielectric layer 440 may be similar to those of the dielectric layer 380, and the details are not described again herein to avoid repetition.

Referring to FIG. 1, the metal layer 460 may be disposed on the dielectric layer 440. In some embodiments, the metal layer 460 may be positioned above the metal layer 420. Furthermore, the metal layer 460 may be extended through the dielectric layer 440, so an electrical connection may be established between the metal layer 460 and the metal layer 420. According to some embodiments of the present disclosure, the metal layer 460 may function as a capacitor electrode and a metal transmission line. The materials and the formation of the metal layer 460 may be similar to those of the ohmic layer 320, and the details are not described again herein to avoid repetition.

In some embodiments, before the deposition of the metal layer 460, via holes may be formed in the dielectric layer 440. According to some embodiments of the present disclosure, the via holes may be viewed as openings within the dielectric layer 440, allowing the element below and above the dielectric layer 440 to establish electrical connection. In a specific embodiment of the present disclosure, the via holes may allow the metal layer 420 and the metal layer 460 to be electrically connected for signal transmission. From the top view, the via holes may be arranged on the metal layer 420 in the source region 10S and the drain region 10D, respectively. The critical dimension (CD) of the via holes from the top view may be between 1 μm and 500 μm. If the critical dimension of the via holes is too large, the misalignment may occur between the via holes and the underlying or overlying structures. If the critical dimension of the via holes is too small, the electrical connection may not be properly established. The via holes may be formed by patterning the dielectric layer 440, which include photolithography process and etching process.

It should be understood that the metal layer 420, the dielectric layer 440, and the metal layer 460 may also constitute a capacitor structure (not shown). In some embodiments, in addition to forming the metal layer 420, the dielectric layer 440, and the metal layer 460 in the source region 10S and in the drain region 10D, the metal layer 420, the dielectric layer 440, and the metal layer 460 may be further disposed as a bottom electrode, an insulator, and a top electrode in the capacitor structure, respectively. It should be appreciated that for the capacitor structure, there may not be via holes formed within the dielectric layer 440, since the bottom electrode (or the metal layer 420) and the top electrode (or the metal layer 460) of the capacitor structure should be insulated from each other.

Still referring to FIG. 1, the dielectric layer 480 may be conformally formed on the dielectric layer 440 and the metal layer 460. According to some embodiments of the present disclosure, the dielectric layer 480 may provide mechanical protection and electrical insulation for the underlying structures. The materials and the formation of the dielectric layer 480 may be similar to those of the dielectric layer 380, and the details are not described again herein to avoid repetition.

Referring to FIG. 1, the insulating film 500 may be disposed on the dielectric layer 480. In some embodiments, the insulating film 500 may cover the insulating film 400, the metal layer 420, and the metal layer 460. According to some embodiments of the present disclosure, the insulating film 500 may provide insulation and planarization for the intermediate structure of the semiconductor device 10. The thickness of the insulating film 500 may be adjusted to improve the performance of the semiconductor devices 10. The materials and the formation of the insulating film 500 may be similar to those of the insulating film 400, and the details are not described again herein to avoid repetition.

Still referring to FIG. 1, the adhesion layer 520 may be disposed on the insulating film 500. According to some embodiments of the present disclosure, the adhesion layer 520 may isolate the insulating film 500 from the subsequently formed extended portion (to be described with more details in reference with FIG. 2) of the first conductive structure (including the seed layer 540 and the metal layer 560). The thickness of the adhesion layer 520 may be, for example, 300 Å. The thickness of the adhesion layer 520 may be adjusted to improve the performance of the semiconductor devices 10. The materials and the formation of the adhesion layer 520 may be similar to those of the dielectric layer 380, and the details are not described again herein to avoid repetition.

As mentioned previously, benzocyclobutene can absorb aqueous solution by nature, which leads to moisture (or impurities) entering the insulating film 500. Different from the ohmic layer 320, the metal layer 360, the metal layer 420, and the metal layer 460, the first conductive structure (including the seed layer 540 and the metal layer 560) may be formed specifically by the plating process. When the insulating film 500 is directly exposed to the plating process of the first conductive structure, the plating solution may be absorbed by the insulating film 500. As a result, the reliability of the semiconductor device 10 may suffer severe failure.

According to some embodiments of the present disclosure, the adhesion layer 520 may be interposed between the insulating film 500 and the extended portion of the first conductive structure. The placement of the adhesion layer 520 may minimize the moisture entering the insulating film 500 and the first conductive structure. As a result, the reliability (such as the biased highly accelerated stress test) of the semiconductor device 10 may be improved.

Referring to FIG. 1, the via holes 500V may be formed in the insulating film 500. In some embodiments, the via holes 500V may be penetrated through the adhesion layer 520, the insulating film 500, the dielectric layer 480, and a portion of the metal layer 460. According to some embodiments of the present disclosure, the via holes 500V may be viewed as openings within the adhesion layer 520, the insulating film 500, and the dielectric layer 480, allowing the element below and above the insulating film 500 to establish electrical connection. In a specific embodiment of the present disclosure, the via holes 500V may allow the metal layer 460 and the subsequently formed first conductive structure (including the seed layer 540 and the metal layer 560) to be electrically connected for signal transmission. From the top view, the via holes 500V may be arranged on the metal layer 460 in the source region 10S and the drain region 10D, respectively. The critical dimension (CD) of the via holes 500V from the top view may be between 1 μm and 500 μm. If the critical dimension of the via holes 500V is too large, the misalignment may occur between the via holes 500V and the underlying or overlying structures. If the critical dimension of the via holes 500V is too small, the electrical connection may not be properly established. The via holes 500V may be formed by patterning the adhesion layer 520, the insulating film 500, and the dielectric layer 480, which include photolithography process and etching process. The via holes 500V may be over-etched to remove the portion near the top surface of the metal layer 460, so a more effective contact between the metal layer 460 and the first conductive structure may be formed.

Conventionally, forming the via holes through the insulating film may involve sequentially depositing a dielectric layer and a photoresist layer. The photoresist layer may be used to pattern the underlying dielectric layer, and the patterned dielectric layer may function as a hard mask to form the via holes. The advantage of forming the via holes through the hard mask is to more effectively control the profile of the via holes. However, the dielectric layer and the photoresist layer may all be removed after the via holes are formed, and the insulating film may be exposed to the subsequent processing (such as the plating solution). In order to form the adhesion layer 520 on the insulating film 500, only the photoresist layer may be used to pattern the via holes 500V.

Still referring to FIG. 1, the seed layer 540 may be conformally formed on the adhesion layer 520 and into the via holes 500V. Initially, the seed layer 540 may be deposited on the entire wafer of the semiconductor device 10. According to some embodiments of the present disclosure, the seed layer 540 may allow the entire wafer of the semiconductor device 10 to be conducting, which may enable the metal layer 560 to be plated thereon. The thickness of the seed layer 540 may be adjusted to improve the performance of the semiconductor devices 10. The materials and the formation of the seed layer 540 may be similar to those of the ohmic layer 320, and the details are not described again herein to avoid repetition. In a specific embodiment of the present disclosure, the seed layer 540 may include titanium tungsten (TiW), and may be formed by the plating process.

Referring to FIG. 1, the metal layer 560 may be disposed on the seed layer 540. In some embodiments, the metal layer 560 may be filled into the via holes 500V, and may be extended above the surface of the adhesion layer 520. According to some embodiments of the present disclosure, the first conductive structure (including the seed layer 540 and the metal layer 560) may serve as metal lines for signal transmission. The thickness of the metal layer 560 may be adjusted to improve the performance of the semiconductor devices 10. The materials and the formation of the metal layer 560 may be similar to those of the ohmic layer 320, and the details are not described again herein to avoid repetition. In a specific embodiment of the present disclosure, the metal layer 560 may include gold, and may be formed by the plating process.

In some embodiments, a patterned photoresist layer may first be formed on the seed layer 540, and the via holes 500V are exposed through the patterned photoresist layer. After that, the entire wafer of the semiconductor device 10 may be soaked into the plating solution (which serves as a precursor) and biased, so the target material (such as gold) may be plated on the exposed seed layer 540 through the oxidation reduction. During the photoresist removal process, the portion of the plated material disposed on the photoresist layer may be removed along with the photoresist layer, and the remaining portion of the plated material becomes the metal layer 560 that is disposed in the source region 10S and the drain region 10D.

It should be appreciated that the photoresist removal process cannot remove the underlying seed layer 540. An additional de-plating process is necessary to remove the portion of the seed layer 540 not covered by the metal layer 560. In order to ensure the seed layer 540 is removed completely, the de-plating process may be over etched to form undercuts under the metal layer 560. As shown in FIG. 1, the portions of the seed layer 540 close to the edge of the metal layer 560 may be partially etched away, leaving a gap vertically between the adhesion layer 520 and the metal layer 560 (to be described with more details in reference with FIG. 2).

Still referring to FIG. 1, the adhesion layer 580 may be disposed on the adhesion layer 520 and the metal layer 560. In some embodiments, the adhesion layer 580 may be deposited on the exposed portion of the adhesion layer 520 and the top surface of the metal layer 560. The exposed portion of the adhesion layer 520 may be referred to as the portion of the adhesion layer 520 not being covered by the first conductive structure (including the seed layer 540 and the metal layer 560). In the present embodiment, the adhesion layer 580 may only be formed on exposed horizontal surfaces. In some embodiments, the adhesion layer 580 does not exist on the sidewalls of the metal layer 560, and does not fill the gap vertically between the adhesion layer 520 and the metal layer 560. According to some embodiments of the present disclosure, the adhesion layer 580 may enable the insulating film 500 to have a more superior adhesion with the subsequently formed insulating film 600. Although the adhesion layer 580 cannot extend onto the sidewalls of the metal layer 560, the overall performance of the semiconductor device 10 may not be significantly affected. The thickness of the adhesion layer 580 may be adjusted to improve the performance of the semiconductor devices 10. The materials and the formation of the adhesion layer 580 may be similar to those of the dielectric layer 380, and the details are not described again herein to avoid repetition.

Referring to FIG. 1, the insulating film 600 may be disposed on the adhesion layer 580. In some embodiments, the insulating film 600 may cover the metal layer 560 and the adhesion layer 580. According to some embodiments of the present disclosure, the insulating film 600 may provide insulation and planarization for the intermediate structure of the semiconductor device 10. The thickness of the insulating film 600 may be adjusted to improve the performance of the semiconductor devices 10. The materials and the formation of the insulating film 600 may be similar to those of the insulating film 400, and the details are not described again herein to avoid repetition.

Figure 2:
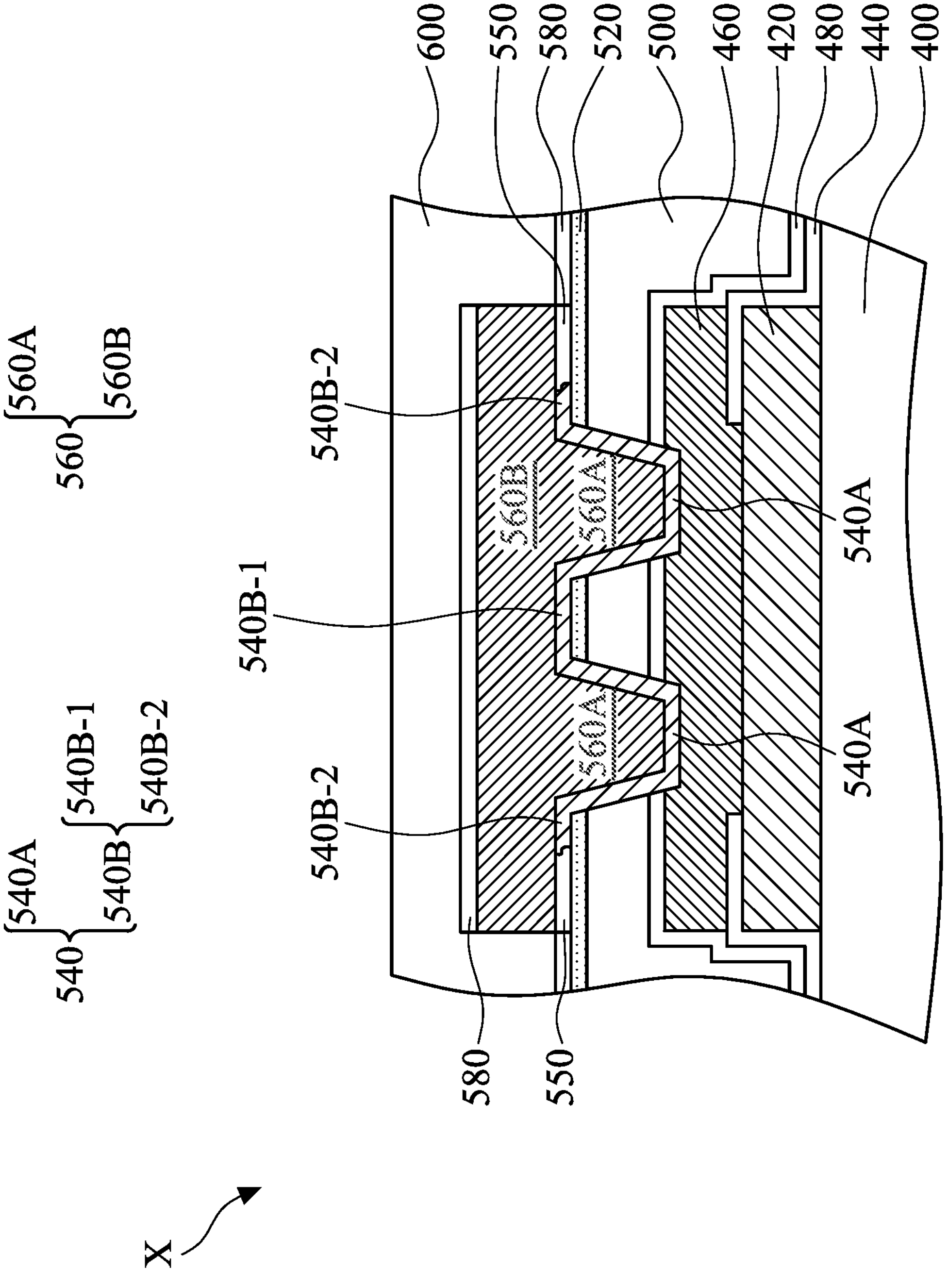
FIG. 2 is an enlarged view of the semiconductor device illustrated in FIG. 1, according to some embodiments of the present disclosure.

FIG. 2 is an enlarged view of a region X labeled in FIG. 1, according to some embodiments of the present disclosure. The seed layer 540 may include a connected portion 540A and an extended portion 540B. The extended portion 540B may further include a complete segment 540B-1 and an incomplete segment 540B-2. The metal layer 560 may include a connected portion 560A and an extended portion 560B. A gap 550 may be disposed vertically between the adhesion layer 520 and the metal layer 560. For illustrated purpose, the substrate 100, the epitaxial layer 200, the ohmic layer 320, the gate structure 340, the metal layer 360, and the dielectric layer 380 are omitted. The features of the insulating film 400, the metal layer 420, the dielectric layer 440, the metal layer 460, the dielectric layer 480, the insulating film 500, the adhesion layer 520, the seed layer 540, the metal layer 560, the adhesion layer 580, and the insulating film 600 are similar to those illustrated in FIG. 1, and the details are not described again herein to avoid repetition.

Referring to FIG. 2, the connected portion 540A of the seed layer 540 and the connected portion 560A of the metal layer 560 may be disposed in the via holes 500V (referring to FIG. 1). From another perspective, the connected portion 540A and the connected portion 560A may be collectively considered as a via structure that electrically connects the extended portion (including the extended portion 540B and the extended portion 560B) of the first conductive structure and the metal layer 460. Since the adhesion layer 520 is not extended into the via holes 500V, the connected portion 540A of the seed layer 540 is in direct contact with the insulating film 500. The connected portion 540A of the seed layer 540 may cover the sidewalls and the bottom surface of the connected portion 560A of the metal layer 560. In some embodiments, the connected portion 540A of the seed layer 540 may be disposed between the insulating film 500 and the connected portion 560A of the metal layer 560.

Still referring to FIG. 2, the extended portion 540B of the seed layer 540 and the extended portion 560B of the metal layer 560 may be disposed on the top surface of the insulating film 500. The extended portion 540B of the seed layer 540 may be disposed between the top surface of the insulating film 500 and the bottom surface of the extended portion 560B of the metal layer 560. As mentioned previously, since the de-plating process of the seed layer 540 may be over etched, the extended portion 540B may thus include the complete segment 540B-1 and the incomplete segment 540B-2. The complete segment 540B-1 may be positioned between the via holes 500V, while the incomplete segment 540B-2 may be positioned between the via holes 500V and the edge of the metal layer 560. Because the de-plating process may inwardly etch the seed layer 540 from the edge of the metal layer 560, the extended portion 540B of the seed layer 540 may not remain intact. Therefore, the adhesion layer 520 may cover and directly contact a part of the bottom surface of the extended portion (such as the extended portion 540B) of the first conductive structure. The adhesion layer 520 may be exposed to the gap 550, which is a space generated from forming the incomplete segment 540B-2. In some embodiments, the gap 550 may be isolated from the insulating film 500 by the adhesion layer 520.

Referring to FIG. 2, the adhesion layer 520 may be disposed between the insulating film 500 and the insulating film 600. The adhesion layer 520 may be disposed between the insulating film 500 and the extended portion 540B of the seed layer 540. The adhesion layer 580 may cover and directly contact the top surface of the first conductive structure (more specifically, the top surface of the extended portion 560B). The adhesion layer 520 may be disposed between the insulating film 500 and the adhesion layer 580. The adhesion layer 580 may be disposed between the top surface of the first conductive structure (more specifically, the top surface of the extended portion 560B) and the insulating film 600. The extended portion (including the extended portion 540B and the extended portion 560B) of the first conductive structure may be sandwiched between the adhesion layer 520 and the adhesion layer 580. The placement of the adhesion layer 520 and the adhesion layer 580 may minimize the moisture entering the insulating film 500, the insulating film 600, and the first conductive structure. As a result, the reliability (such as the biased highly accelerated stress test) of the semiconductor device 10 may be improved.

Figure 3:
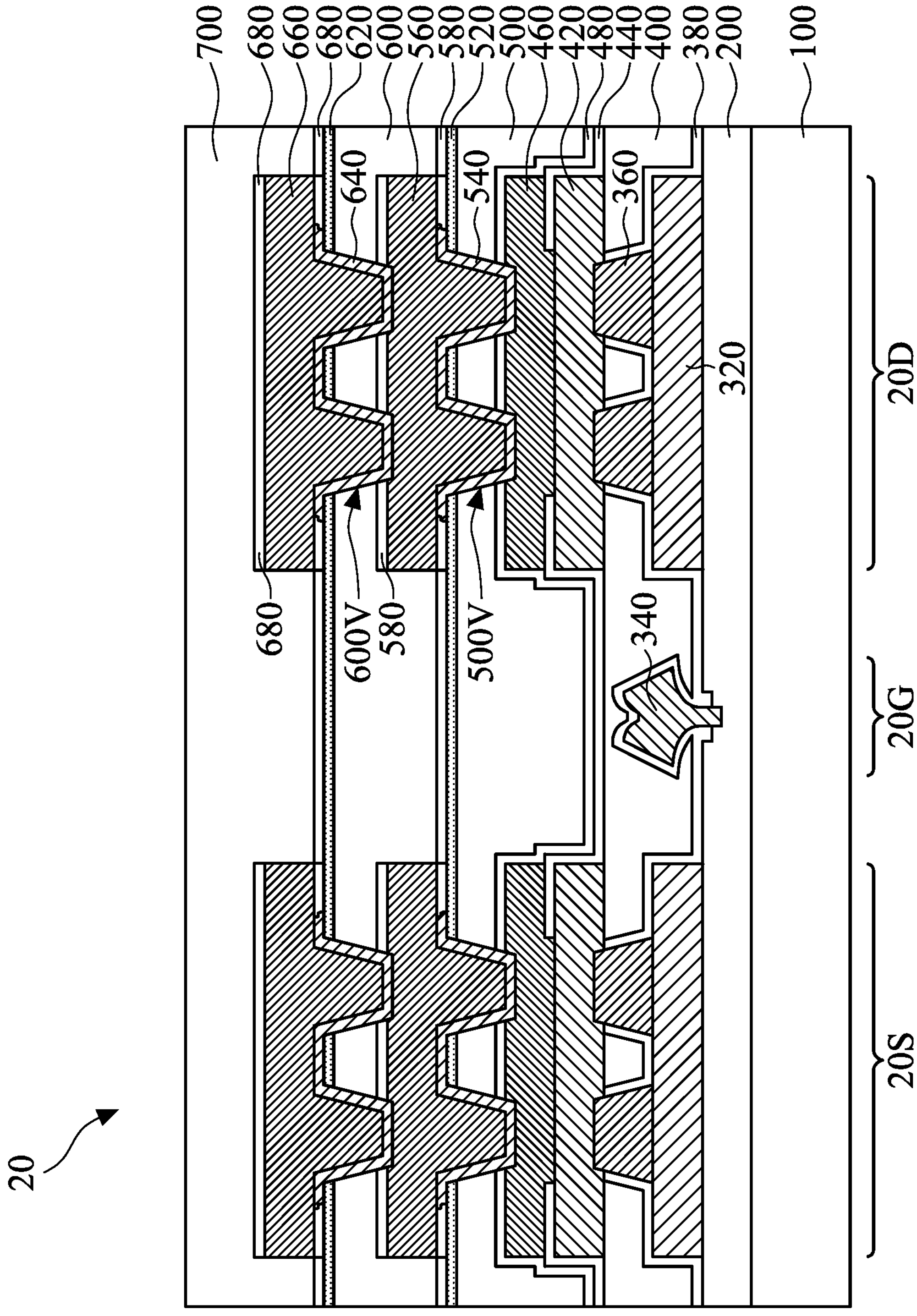
FIG. 3 is a cross-sectional view of a semiconductor device, according to some embodiments of the present disclosure.

FIG. 3 is a cross-sectional view of a semiconductor device 20, according to some embodiments of the present disclosure. In comparison with FIG. 1, the semiconductor device 20 may further include an adhesion layer 620, a second conductive structure (including the seed layer 640 and the metal layer 660), an adhesion layer 680, and an insulating film 700. The semiconductor device 20 may be compartmentalized into a source region 20S, a drain region 20D, and a gate region 20G of the transistor structure (such as the high electron mobility transistor). The features of the substrate 100, the epitaxial layer 200, the ohmic layer 320, the gate structure 340, the metal layer 360, the dielectric layer 380, the insulating film 400, the metal layer 420, the dielectric layer 440, the metal layer 460, the dielectric layer 480, the insulating film 500, the adhesion layer 520, the seed layer 540, the metal layer 560, the adhesion layer 580, and the insulating film 600 are similar to those illustrated in FIG. 1, and the details are not described again herein to avoid repetition.

Referring to FIG. 3, the adhesion layer 620 may be disposed on the insulating film 600. According to some embodiments of the present disclosure, the adhesion layer 620 may isolate the insulating film 600 from the extended portion of the subsequently formed second conductive structure (including the seed layer 640 and the metal layer 660). The thickness of the adhesion layer 620 may be adjusted to improve the performance of the semiconductor devices 20. The materials and the formation of the adhesion layer 620 may be similar to those of the adhesion layer 520, and the details are not described again herein to avoid repetition.

According to some embodiments of the present disclosure, the adhesion layer 620 may be interposed between the insulating film 600 and the extended portion of the second conductive structure. Similar to the adhesion layer 520, the placement of the adhesion layer 620 may also minimize the moisture entering the insulating film 600 and the second conductive structure. As a result, the reliability (such as the biased highly accelerated stress test) of the semiconductor device 20 may be improved.

Still referring to FIG. 3, the via holes 600V may be formed in the insulating film 600. In some embodiments, the via holes 600V may be penetrated through the adhesion layer 620, the insulating film 600, the adhesion layer 580, and a portion of the metal layer 560. According to some embodiments of the present disclosure, the via holes 600V may be viewed as openings within the adhesion layer 620, the insulating film 600, and the adhesion layer 580, allowing the element below and above the insulating film 600 to establish electrical connection. In a specific embodiment of the present disclosure, the via holes 600V may allow the first conductive structure (including the seed layer 540 and the metal layer 560) and the subsequently formed second conductive structure (including the seed layer 640 and the metal layer 660) to be electrically connected for signal transmission. From the top view, the via holes 600V may be arranged on the first conductive structure in the source region 20S and the drain region 20D, respectively. The critical dimension (CD) of the via holes 600V from the top view may be between 1 μm and 500 μm. If the critical dimension of the via holes 600V is too large, the misalignment may occur between the via holes 600V and the underlying or overlying structures. If the critical dimension of the via holes 600V is too small, the electrical connection may not be properly established. The formation of the via holes 600V may be similar to that of the via holes 500V, and the details are not described again herein to avoid repetition.

Referring to FIG. 3, the seed layer 640 may be conformally formed on the adhesion layer 620 and into the via holes 600V. Initially, the seed layer 640 may be deposited on the entire wafer of the semiconductor device 20. According to some embodiments of the present disclosure, the seed layer 640 may allow the entire wafer of the semiconductor device 20 to be conducting, which may enable the metal layer 660 to be plated thereon. The thickness of the seed layer 640 may be adjusted to improve the performance of the semiconductor devices 20. The materials and the formation of the seed layer 640 may be similar to those of the seed layer 540, and the details are not described again herein to avoid repetition.

Still referring to FIG. 3, the metal layer 660 may be disposed on the seed layer 640. In some embodiments, the metal layer 660 may be filled into the via holes 600V, and may be extended above the surface of the adhesion layer 620. Moreover, the metal layer 660 may be extended beyond the source region 20S or the drain region 20D. According to some embodiments of the present disclosure, the second conductive structure (including the seed layer 640 and the metal layer 660) may function as bonding pads to be connected to external circuits, such as a printed circuit board (PCB). The thickness of the metal layer 660 may be adjusted to improve the performance of the semiconductor devices 20. The materials and the formation of the metal layer 660 may be similar to those of the metal layer 560, and the details are not described again herein to avoid repetition.

It should be appreciated that the photoresist removal process cannot remove the underlying seed layer 640. An additional de-plating process is necessary to remove the portion of the seed layer 640 not covered by the metal layer 660. In order to ensure the seed layer 640 is removed completely, the de-plating process may be over etched to form undercuts under the metal layer 660. As shown in FIG. 3, the portions of the seed layer 640 close to the edge of the metal layer 660 may be partially etched away, leaving a gap vertically between the adhesion layer 620 and the metal layer 660. The feature of the gap is similar to the gap 550 illustrated in FIG. 2, and the details are not described again herein to avoid repetition.

Referring to FIG. 3, the adhesion layer 680 may be disposed on the adhesion layer 620 and the metal layer 660. In some embodiments, the adhesion layer 680 may be deposited on the exposed portion of the adhesion layer 620 and the top surface of the metal layer 660. The exposed portion of the adhesion layer 620 may be referred to as the portion of the adhesion layer 620 not being covered by the second conductive structure (including the seed layer 640 and the metal layer 660). In the present embodiment, the adhesion layer 680 may only be formed on exposed horizontal surfaces. In some embodiments, the adhesion layer 680 does not exist on the sidewalls of the metal layer 660, and does not fill the gap vertically between the adhesion layer 620 and the metal layer 660. According to some embodiments of the present disclosure, the adhesion layer 680 may enable the insulating film 600 to have a more superior adhesion with the subsequently formed insulating film 700. Although the adhesion layer 680 cannot extend onto the sidewalls of the metal layer 660, the overall performance of the semiconductor device 20 may not be significantly affected. The thickness of the adhesion layer 680 may be adjusted to improve the performance of the semiconductor devices 20. The materials and the formation of the adhesion layer 680 may be similar to those of the adhesion layer 580, and the details are not described again herein to avoid repetition.

Still referring to FIG. 3, the insulating film 700 may be disposed on the adhesion layer 680. In some embodiments, the insulating film 700 may cover the metal layer 660 and the adhesion layer 680. According to some embodiments of the present disclosure, the insulating film 700 may provide insulation and planarization for the intermediate structure of the semiconductor device 20. The thickness of the insulating film 700 may be adjusted to improve the performance of the semiconductor devices 20. The materials and the formation of the insulating film 700 may be similar to those of the insulating film 400, and the details are not described again herein to avoid repetition.

Referring to FIG. 3, the adhesion layer 620 may be disposed between the insulating film 600 and the insulating film 700. The adhesion layer 620 may be disposed between the insulating film 600 and the seed layer 640. The adhesion layer 680 may cover and directly contact the top surface of the second conductive structure. The adhesion layer 620 may be disposed between the insulating film 600 and the adhesion layer 680. The adhesion layer 680 may be disposed between the top surface of the second conductive structure and the insulating film 700. The extended portion of the second conductive structure may be sandwiched between the adhesion layer 620 and the adhesion layer 680. The placement of the adhesion layer 620 and the adhesion layer 680 may minimize the moisture entering the insulating film 600, the insulating film 700, and the second conductive structure. As a result, the reliability (such as the biased highly accelerated stress test) of the semiconductor device 20 may be improved.

Figure 4:
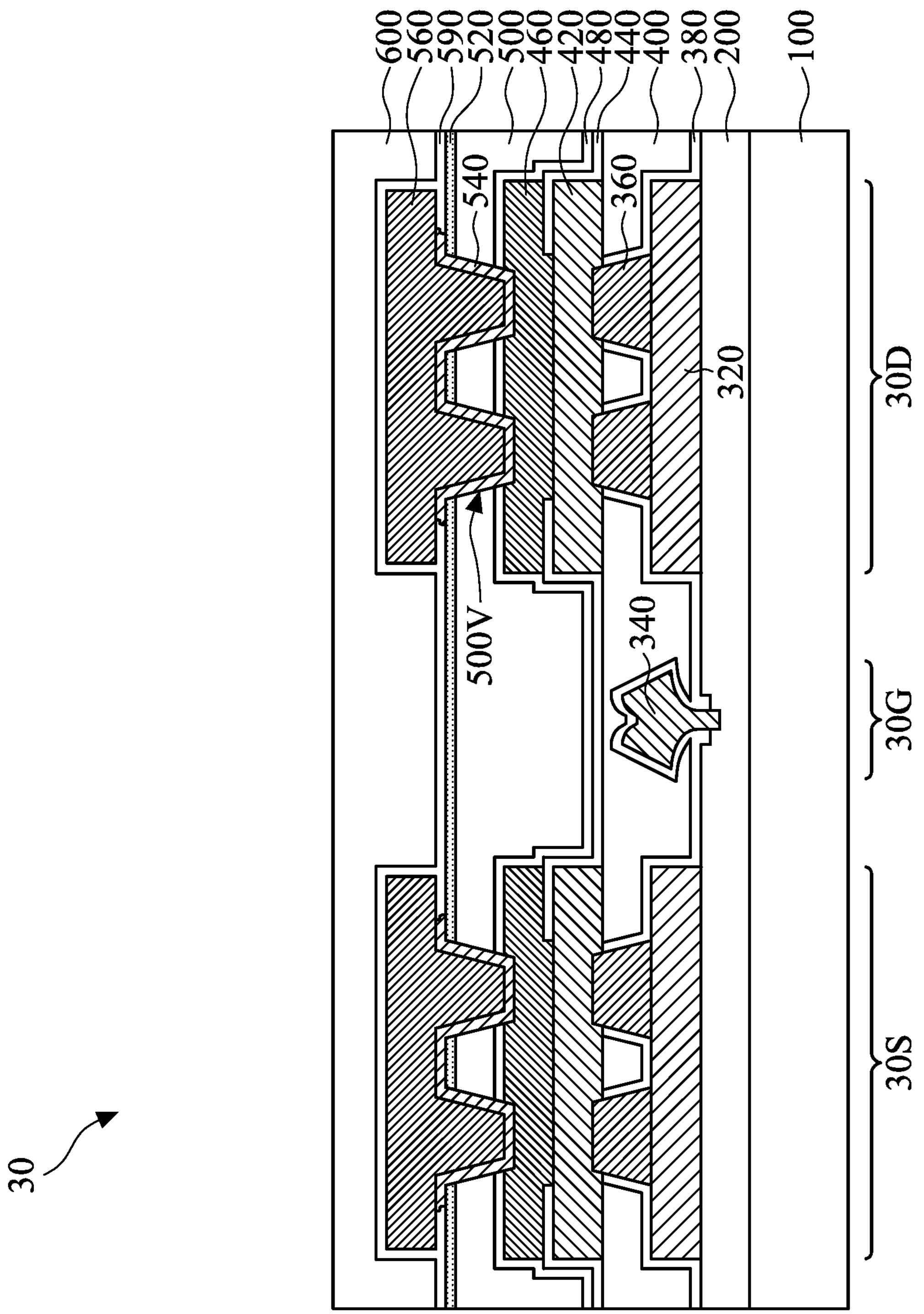
FIG. 4 is a cross-sectional view of a semiconductor device, according to other embodiments of the present disclosure.

FIG. 4 is a cross-sectional view of a semiconductor device 30, according to other embodiments of the present disclosure. In comparison with FIG. 1, the semiconductor device 30 may include an adhesion layer 590 that is continuously extended on the sidewalls of the metal layer 560, and filled the gap vertically between the adhesion layer 520 and the metal layer 560. The semiconductor device 30 may be compartmentalized into a source region 30S, a drain region 30D, and a gate region 30G of the transistor structure (such as the high electron mobility transistor). The features of the substrate 100, the epitaxial layer 200, the ohmic layer 320, the gate structure 340, the metal layer 360, the dielectric layer 380, the insulating film 400, the metal layer 420, the dielectric layer 440, the metal layer 460, the dielectric layer 480, the insulating film 500, the adhesion layer 520, the seed layer 540, the metal layer 560, and the insulating film 600 are similar to those illustrated in FIG. 1, and the details are not described again herein to avoid repetition.

Referring to FIG. 4, the adhesion layer 590 may cover the sidewalls of the extended portion of the first conductive structure (including the seed layer 540 and the metal layer 560). Moreover, the adhesion layer 590 may cover and directly contact the bottom surface of the metal layer 560. In a specific embodiment of the present disclosure, the adhesion layer 590 may be formed by atomic layer deposition. Comparing to the adhesion layer 580, the adhesion layer 590 may exhibit a more superior coverage rate. The placement of the adhesion layer 590 may more effectively minimize the moisture entering the insulating film 600 and the first conductive structure. As a result, the reliability (such as the biased highly accelerated stress test) of the semiconductor device 30 may be improved.

According to some embodiments of the present disclosure, the adhesion layer 520 may be interposed between the insulating film 500 and the extended portion the first conductive structure. The placement of the adhesion layer 520 may minimize the moisture entering the insulating film 500 and the first conductive structure. As a result, the reliability (such as the biased highly accelerated stress test) of the semiconductor device 30 may be improved.

Figure 5:
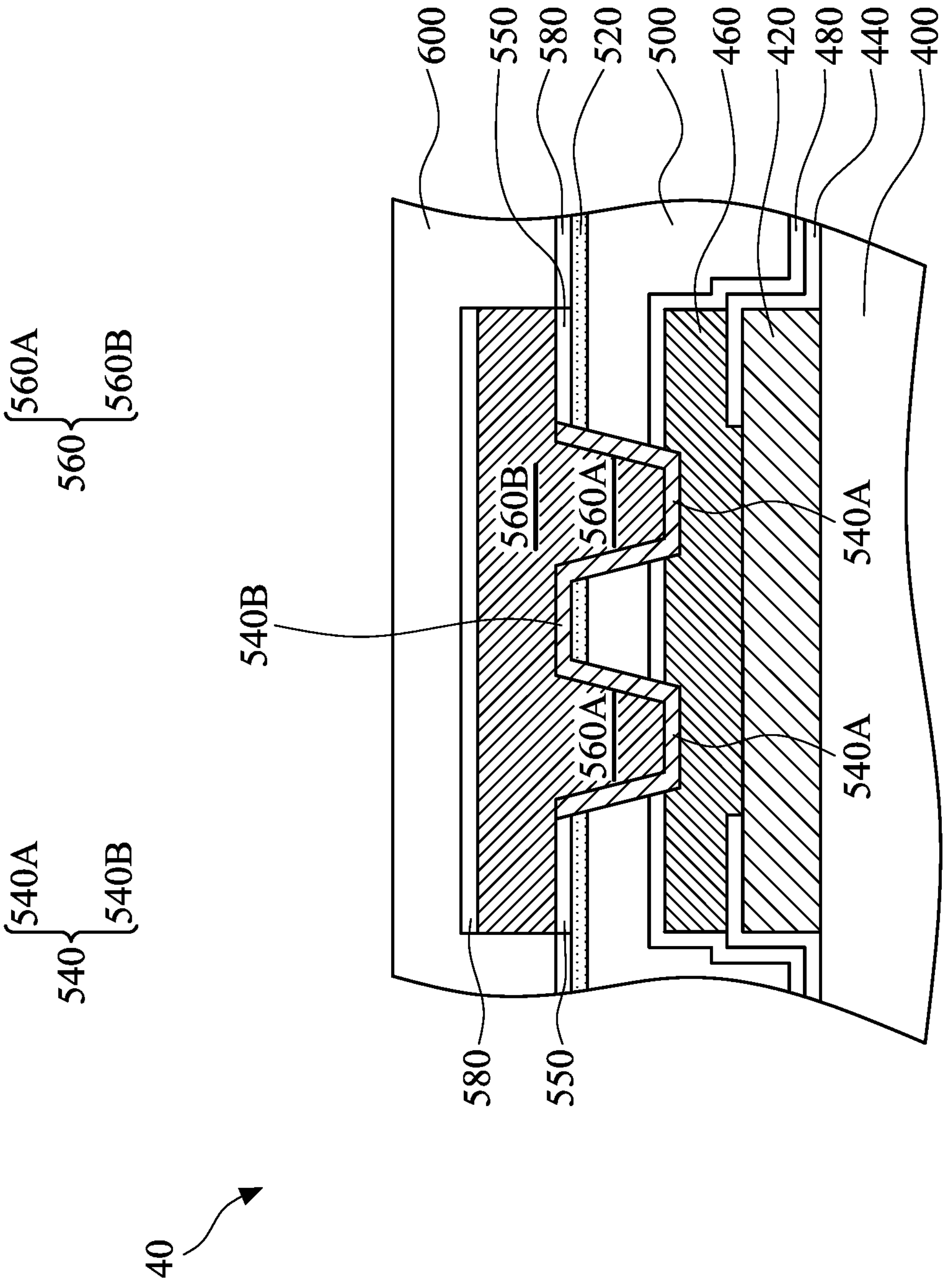
FIG. 5 is a portion of a cross-sectional view of a semiconductor device, according to other embodiments of the present disclosure.

FIG. 5 is a portion of a cross-sectional view of a semiconductor device 40, according to other embodiments of the present disclosure. In comparison with FIG. 2, the seed layer 540 of the semiconductor 40 does not include an incomplete segment. The features of the insulating film 400, the metal layer 420, the dielectric layer 440, the metal layer 460, the dielectric layer 480, the insulating film 500, the adhesion layer 520, the seed layer 540 (including the connected portion 540A and the extended portion 540B), the gap 550, the metal layer 560 (including the connected portion 560A and the extended portion 560B), the adhesion layer 580, and the insulating film 600 are similar to those illustrated in FIG. 2, and the details are not described again herein to avoid repetition.

Referring to FIG. 5, the extended portion 540B of the seed layer 540 and the extended portion 560B of the metal layer 560 may be disposed on the top surface of the insulating film 500. The extended portion 540B of the seed layer 540 may be disposed between the top surface of the insulating film 500 and the bottom surface of the extended portion 560B of the metal layer 560. In the present embodiment, the de-plating process of the seed layer 540 may be over etched, and the segment of the extended portion 540B positioned between the via holes 500V and the edge of the metal layer 560 may be completely removed. The resulting extended portion 540B may only remain between the via holes 500V. In some embodiments, the de-plating process may inwardly etch away the seed layer 540 from the edge of the metal layer 560 to the via holes 500V. Therefore, the adhesion layer 520 may cover and directly contact a part of the bottom surface of the extended portion (such as the extended portion 540B) of the first conductive structure. The adhesion layer 520 may be exposed to the gap 550, which is a space laterally between the via holes 500V and the edge of the metal layer 560.

Still referring to FIG. 5, the adhesion layer 520 may be disposed between the insulating film 500 and the insulating film 600. The adhesion layer 520 may be disposed between the insulating film 500 and the extended portion 540B of the seed layer 540. The adhesion layer 580 may cover and directly contact the top surface of the first conductive structure (more specifically, the top surface of the extended portion 560B). The adhesion layer 520 may be disposed between the insulating film 500 and the adhesion layer 580. The adhesion layer 580 may be disposed between the top surface of the first conductive structure (more specifically, the top surface of the extended portion 560B) and the insulating film 600. The extended portion (including the extended portion 540B and the extended portion 560B) of the first conductive structure may be sandwiched between the adhesion layer 520 and the adhesion layer 580.

According to some embodiments of the present disclosure, the adhesion layer 520 may be interposed between the insulating film 500 and the extended portion of the first conductive structure. The placement of the adhesion layer 520 may minimize the moisture entering the insulating film 500 and the first conductive structure. As a result, the reliability (such as the biased highly accelerated stress test) of the semiconductor device 40 may be improved.

Conventional semiconductor device utilizes the insulating film including benzocyclobutene for planarization in the intermediate stages, and this enables the subsequently formed conductive structure to be deposited on the planar surface. If the conductive structure disposed directly above the insulating film is formed by the plating process, the plating solution may be absorbed by the insulating film, which leads to the reliability failure. The present disclosure incorporates the adhesion layer between the insulating film and the conductive structure. The adhesion layer may minimize the moisture of the plating solution entering the insulating film and the conductive structure. As a result, the reliability of the semiconductor device may be improved.

The foregoing outlines features of several embodiments so that those skilled in the art will better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristics described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. A semiconductor device, comprising:
a substrate, comprising:
a gate region; and
a source region and a drain region disposed on opposing sides of the gate region;
a gate structure disposed in the gate region;
an ohmic layer disposed in the source region or the drain region;
a first insulating film disposed on the substrate and having at least one via;
a second insulating film disposed on the first insulating film;
a first adhesion layer disposed on the first insulating film;
a first conductive structure disposed in the at least one via and having an extended portion extending to a top surface of the first insulating film; and
a second adhesion layer disposed on the first conductive structure, wherein the first adhesion layer covers at least a part of a bottom surface of the extended portion of the first conductive structure disposed on the ohmic layer in the source region or the drain region adjacent to the gate structure, and the second adhesion layer covers at least a part of a top surface of the first conductive structure.

2. The semiconductor device of claim 1, wherein the semiconductor device comprises a high electron mobility transistor (HEMT).

3. The semiconductor device of claim 1, wherein the first conductive structure comprises a seed layer and a metal layer.

4. The semiconductor device of claim 3, wherein the seed layer is disposed in the at least one via and covers sidewalls of the metal layer.

5. The semiconductor device of claim 3, wherein the seed layer is disposed between the top surface of the first insulating film and a bottom surface of the metal layer.

6. The semiconductor device of claim 1, wherein the first adhesion layer is disposed between the first insulating film and the second insulating film.

7. The semiconductor device of claim 1, wherein the second adhesion layer is disposed between the top surface of the first conductive structure and the second insulating film.

8. The semiconductor device of claim 1, wherein the second adhesion layer covers a sidewall of the extended portion.

9. The semiconductor device of claim 1, wherein the first adhesion layer is in direct contact with the bottom surface of the extended portion, and the second adhesion layer is in direct contact with the top surface of the first conductive structure.

10. The semiconductor device of claim 1, wherein the first adhesion layer and the second adhesion layer are inorganic films.

11. The semiconductor device of claim 10, wherein the first adhesion layer and the second adhesion layer comprise zirconium oxide ($ZrO_2$), aluminum oxide ($Al_2O_3$), silicon dioxide ($SiO_2$), silicon oxynitride (SiON), silicon nitride (SiN), silicon carbonitride (SiCN), silicon oxycarbonitride (SiOCN), aluminum nitride (AlN), titanium oxide ($TiO_2$), hafnium oxide ($HfO_2$), or tantalum oxide ($Ta_2O_5$).

12. The semiconductor device of claim 1, wherein the first insulating film and the second insulating film are organic insulating films.

13. The semiconductor device of claim 12, wherein the first insulating film and the second insulating film comprise benzocyclobutene (BCB).

14. The semiconductor device of claim 1, further comprising a second conductive structure disposed on the first conductive structure.

15. A semiconductor device, comprising:
a III-V compound semiconductor substrate, comprising:
a gate region; and
a source region and a drain region disposed on opposing sides of the gate region;
a gate structure disposed in the gate region;
an ohmic layer disposed in the source region or the drain region;
a first insulating film disposed on the substrate and having at least one via;
a second insulating film disposed on the first insulating film;
a first adhesion layer disposed on the first insulating film;
a conductive structure disposed in the at least one via and on a top surface of the first insulating film; and
a second adhesion layer disposed on the conductive structure, wherein at least a part of the conductive structure is sandwiched between the first adhesion layer and the second adhesion layer, wherein the conductive structure is disposed on the ohmic layer in the source region or the drain region adjacent to the gate structure.

16. The semiconductor device of claim 15, wherein the conductive structure comprises a seed layer and a metal layer.

17. The semiconductor device of claim 16, wherein a connected portion of the seed layer and a connected portion of the metal layer are disposed in the at least one via, and an extended portion of the seed layer and an extended portion of the metal layer are disposed on the top surface of the first insulating film.

18. The semiconductor device of claim 17, wherein the connected portion of the seed layer is disposed between the first insulating film and the connected portion of the metal layer.

19. The semiconductor device of claim 17, wherein the first adhesion layer is disposed between the first insulating film and the extended portion of the seed layer.

20. The semiconductor device of claim 15, wherein the first adhesion layer is disposed between the first insulating film and the second adhesion layer.

* * * * *